United States Patent [19]
Kozicki

[11] Patent Number: 4,904,338
[45] Date of Patent: Feb. 27, 1990

[54] CARBON ENHANCED VAPOR ETCHING

[75] Inventor: Michael N. Kozicki, Tempe, Ariz.

[73] Assignee: Arizona Board of Regents, Tempe, Ariz.

[21] Appl. No.: 248,773

[22] Filed: Sep. 23, 1988

[51] Int. Cl.[4] .................. B44C 1/22; C03C 15/00; C03C 25/06
[52] U.S. Cl. .................. 156/628; 156/646; 156/657; 156/659.1; 156/904; 252/79.1; 252/79.3
[58] Field of Search .............. 156/628, 643, 646, 653, 156/657, 659.1, 662, 667, 904; 252/79.1, 79.3

[56] References Cited

U.S. PATENT DOCUMENTS

| | | | |
|---|---|---|---|
| 4,053,350 | 10/1977 | Olsen et al. | 156/904 X |
| 4,450,041 | 5/1984 | Aklufi | 156/628 |
| 4,620,898 | 11/1986 | Banks et al. | 156/643 |
| 4,749,440 | 6/1988 | Blackwood et al. | 156/646 |

*Primary Examiner*—William A. Powell
*Attorney, Agent, or Firm*—Richard R. Mybeck

[57] ABSTRACT

A carbon enhanced vapor etching process which eliminates resist development, avoids contact with wet chemicals and plasma, and employs simple universally available process equipment. The process is based on the discovery that the etch rate of silicon dioxide in hydrogen fluoride is greatly enhanced in the presence of carbon. Carbon is provided by an organic or inorganic material deposited on or in the surface of the silicon.

13 Claims, 1 Drawing Sheet

4,904,338

CARBON ENHANCED VAPOR ETCHING

INTRODUCTION

The present invention relates to pattern definition and more particularly to carbon enhanced vapor etching.

BACKGROUND OF THE INVENTION

Pattern definition, the combination of photolithography and etching, has evolved greatly over the past twenty-five years. The levels of integration we are currently witnessing would be impossible without advanced pattern definition schemes. There have been considerable advances in lithographical exposure methods and in the chemistry of resist materials and etchants, but the development of photoresist remains a wet step even in dry etching processes. However, wet developing is undesirable in advanced integrated circuit fabrication because the organic resist material tends to swell when bathed in the developer. This effect leads to a loss in resolution, a problem which must be avoided for small geometry pattern definition. A further problem with wet developing is the formation of developer residue ("scum"), which will act as a block to subsequent etching. There have been many attempts to attain dry developing materials but the results of these efforts have not yet been totally successful.

There are essentially two different etch methods which are used in conjunction with photolithography; wet etching and dry (plasma) etching. Wet etching is unsuitable for advanced fabrication as the substrates must be immersed in "dirty" chemicals which become more contaminated with each batch, and also must ultimately be disposed of in an ecologically safe manner.

Still further, the extended etch times of wet etching will lead to the failure of resist adhesion at the edges of developed patterns and hence resolution will suffer. Wet chemistry is also not favored for reduced geometry features as surface tension effects will exclude the etchant from small openings. Furthermore, attempts to circumvent this latter problem with surfactants can lead to chemical contamination.

Although plasma etching and its derivative processes such as reactive ion etching, are now universally used for the patterning of many different materials because of their freedom from the problems of wet etching, they are still not ideal as the resists produced thereby are usually etched and frequently become cross-linked. The latter effect tends to make resist removal difficult.

Gas plasmas which etch silicon dioxide also tend to attack the underlying silicon and hence end point detection is critical if shallow underlying junctions are to remain intact. There is also the potential for radiation damage of the sensitive oxide in the energetic plasma. This is an important consideration for gate oxides in metal-oxide-semiconductor (MOS) devices as some types of residual damage will alter device characteristics. From a practical point of view, plasma etching equipment is complex and invariably expensive.

The development of the present invention herein denominated "Carbon Enhanced Vapor Etching" or the "CEVE Process", was stimulated by the work of R. L. Bersin et al and a technique they called "permeation etching". (See: Solid State Technology, April 1977, P. 78) Bersin et al discovered that when silicon dioxide is covered with negative photoresist, it can be rapidly etched with anhydrous hydrogen fluoride, (HF), whereas oxide not covered with resist was relatively impervious to attack. The net effect was image reversal on the oxide as the negative resist was exposed, developed to obtain a negative pattern, and then the oxide was etched underneath the resist, leaving the developed or uncovered regions intact. The effect was attributed to the permeation of the anhydrous HF through the resist, where it reacted with some of the components of the organic material, presumably carbon and hydrogen. The carbon/hydrogen "activated" regions were etched more rapidly than oxide exposed to anhydrous HF alone.

The advantage of the technique was the ability to etch small features with a high degree of etch selectivity over silicon without the need for wet chemistry. However, this technique suffered from several problems, the main one being that a develop step was still required. Also, a plasma etching system was used as the process was performed at low pressure and utilized plasma treatment of the exposed oxide to render it inactive. The process was also carried out at relatively high temperature (above 180° C.) which could have resulted in resist flow or difficulties in resist removal for long etching times.

A more practical approach was attempted by R. X. Pei, (Acta Electonica Sinica, No. 1, 1978, p 102) who noted that hydrofluoric acid vapor, produced by bubbling nitrogen through concentrated hydrofluoric acid, would also permeate through the resist to etch the underlying silicon dioxide. The etching effect was considerably accelerated if the negative resist was exposed but not developed prior to etching. Oxide under exposed regions of resist would etch at a faster rate than oxide under unexposed resist, and hence a positive pattern would be formed on the oxide layer (image reversal). This appeared to be an improved silicon dioxide patterning process, although it suffered from the fact that it was limited to optically exposed photoresist coatings and was not explained relative to other carbon sources or exposure methods.

Accordingly, it is toward the provision of a new and unique carbon enhanced vapor etching process that the present invention is directed.

BRIEF SUMMARY OF THE INVENTION

The present invention is based on the discovery that the development step in certain processes, specifically the patterning of silicon dioxide, can be rendered unnecessary when the advanced processing technique, of the present invention, herein called "Carbon Enhanced Vapor Etching" is employed. The elimination of the development process is not only technologically important, but also has significant economic implications in eliminating the use of expensive developers in the process. Also, the novel etching technique of the present invention does not require the substrate to be in contact with wet chemicals or a gas plasma and it is therefore likely that the CEVE pattern definition technique hereinafter described will be welcomed by the semiconductor industry because it avoids all the problems of conventional pattern definition, namely, resist development is not required, wet chemical or plasma contact is unnecessary, and the equipment required is extremely simple.

More particularly, the present invention involves a carbon enhanced vapor etching process which eliminates resist development, avoids contact with wet chemicals and plasma, and employs simple universally available process equipment. The process involves the discovery that the etch rate of silicon dioxide in hydrogen fluoride is greatly enhanced in the presence of carbon. Carbon is provided by an organic or inorganic material deposited on or in the surface of the silicon dioxide.

Accordingly, a principal object of the present invention is to provide a new and improved process for vapor etching which utilizes carbon to enhance the etch rate.

Another object of the present invention is to provide a new and improved process for carbon enhanced vapor etching which avoids contact between the substrate and wet chemicals or gas plasma.

A further object of the present invention is to provide a new and improved process for vapor etching in which no special equipment beyond that normally used for prior art coating and etching systems is required.

A still further object of the present invention is to provide a new and unique method of carbon enhanced vapor etching in which no restriction exists as to the source of the carbon or as to the method of depositing such carbon on or in a layer of silicon dioxide.

Still another object of the present invention is to provide a new and improved process for vapor etching which is carbon enhanced and which, when photoresist is used as the carbon source, eliminates the need for expensive and cumbersome developers.

Another object of the present invention is to provide a simple and economic process for vapor etching which enables multiple etch rates to be established on a single silicon dioxide layer and creates surface relief thereon by the controlled exposure of the overlaying photoresist to appropriate radiation.

Still a further object of the present invention is to provide a high resolution vapor etching process capable of creating features of less than 0.1 micron line width by using carbon-containing films of which are as small as 5 nm in thickness.

These and still further objects as shall hereinafter appear are readily fulfilled by the present invention in a remarkably unexpected fashion as will be readily discerned from the following detailed description of an exemplary embodiment thereof especially when read in conjunction with the accompanying drawing

DESCRIPTION OF PREFERRED EMBODIMENTS

Figure 1:
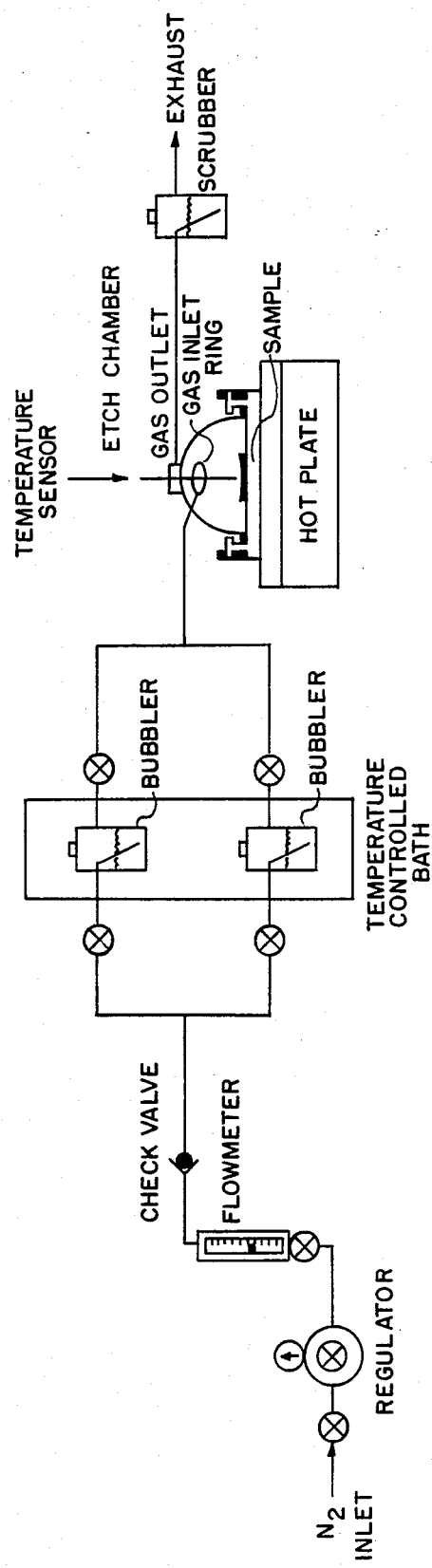
FIG. 1 is a schematic diagram of the process for practice of the present invention.

The present invention is predicated upon the discovery that the etch rate of silicon dioxide in hydrogen fluoride vapor is greatly enhanced when carbon is present, that is, compounds of fluoride and carbon are able to etch silicon dioxide much more rapidly than HF alone. The source of carbon may be an organic or inorganic material which is deposited on or in the surface of the silicon dioxide either by conventional spin-on techniques, physical vapor deposition, chemical vapor deposition, ion-implantation, focused ion-beam implantation, Langmuir-Blodgett film formation or by laser beam, electron beam, or ion-beam stimulated chemical vapor deposition.

Examples of materials and deposition processes are: negative or positive photoresist (spin-on, solution), elemental carbon (evaporation or sputtering, graphite source), elemental carbon (chemical vapor deposition, methane source), and elemental carbon (ion-implanted, low energy, high dose).

The advantage of photosensitive organic compounds (e.g. photoresist) over blanket or selectively deposited non-photosensitive inorganic materials (e.g. carbon) is that it is possible to expose the photoresist through a standard lithographical mask to alter the permeability or reactivity of the material to HF in selected areas. This results in a greater or lesser degree of transmission of the etchant to the oxide surface or greater or lesser reactivity (depending on the resist material used) and hence a larger or smaller etch rate. A resist development step is not required. With the present inventor it is thus possible to produce positive or negative patterns (including image reversal) in the oxide, or produce multiple oxide thicknesses, by using CEVE with the appropriate choice of resist. This is a considerably more advanced process than that developed by Pei, supra. In addition, the CEVE process using photosensitive material is not limited to optical exposure (as in the work of Pei). Other resist exposure methods include: deep ultra violet (u.v.), highly focused electron-beam, ion-beam, laser beam, blanket ion-beam, and x-ray.

It is also possible to photodissociate carbon from various inorganic or organic resist materials to leave carbon rich layers at the oxide surface which may then be used as etch enhancement regions during etching.

Blanket deposited layers of non-photo-sensitive materials do not exhibit differential etch rates in exposed/non-exposed regions as their ability to transmit and react with the HF vapor is not altered by exposure. However, extremely thin layers (approximately 5 nm) of carbon will result in the etch enhancement effect. Since the films can be made so thin, a pattern may be formed by removing the carbon film in selected areas by focused ion-beam sputtering and then etching the oxide in the HF vapor. Alternatively, thin carbon containing films can be deposited by direct writing methods using focused ion-beam implantation of elemental carbon, or laser-, electron-, or focused ion-beam chemical vapor deposition of carbon (or carbon containing compounds) from a low pressure carbon containing source. This is potentially a very high resolution pattern definition technique.

To further aid in the understanding of the present invention, and not by way of limitation, the following examples are presented;

EXAMPLE I

The equipment for the carbon enhanced vapor etching technique is essentially very simple (FIG. 1). The main part of the apparatus is a gas-tight chamber made of polytetrafluoroethylene (Teflon $^{TM}$) or similar nonreactive material (herein "PTFE") mounted on a hotplate which allows sample heating. The chamber has a sample loading port, an inlet ring which allows uniform injection of the etchant at atmospheric pressure, and a reaction product outlet vent which first leads to a simple scrubber and then to an acid exhaust system. There is also a temperature measurement port so that the temperature of the hotplate or the ambient above the substrate can be measured. The inlet may take one of two configurations; (1) nitrogen is passed through a regulator and flowmeter and then bubbled through a 49% hydrofluoric acid source which is maintained at a constant temperature (HF will vaporize at 19.5° C.) by a constant temperature bath to produce hydrated hydrogen fluoride vapor in the nitrogen carrier, (2) anhydrous hydrogen fluoride gas is fed directly into the chamber (after being diluted by nitrogen if required). Water vapor may be added to the HF gas by bubbling $N_2$ through a pure water source and mixing the wet $N_2$ with the HF.

Using different types of photoresist and different process conditions, positive or negative patterns were obtained. Furthermore, different post-etch silicon dioxide thicknesses on a single sample using only one etch step were produced. This phenomenon cannot readily be produced by conventional pattern definition techniques. However, it has potential applications in device fabrication.

The main experimental variables for photoresist as a source of carbon reported herein are: type of photoresist, resist exposure time, soft bake temperature, hard bake temperature, etching (substrate) temperature, and thickness of photoresist.

In the examples reported below, four different photoresist materials were used, namely; KPR variant negative (a type of polyester resin similar to KPR), KTI 602 negative, KTI 809 negative, and KTFR negative. The results of etch rate vs. various parameters are reported below in Examples II-VI. The etching was performed on "dry" oxides, grown in a pure oxygen ambient at 1100° C. This type of oxide is the most difficult to etch due to its relatively high density. Oxide thicknesses, and hence etch rates, were determined using an ellipsometer in conjunction with a profilometer. A Karl-Suss MJB-3 contact aligner with a 310 nm source was used for resist exposure. In these experiments, the typical maximum resist thickness was in the order of 500 nm.

EXAMPLE II

The procedure of Example I was repeated on KPR variant negative. A positive pattern is obtained with this resist as $R_{exp}$ is much larger than $R_{unexp}$. $R_{exp}$ increases with exposure time to produce a maximum value of 62 nm/min whereas $R_{unexp}$ is always equal to the etch rate of bare silicon dioxide 2.5 nm/min. The maximum differential etch rate ($R_{exp}/R_{unexp}$) can therefore be as large as 25. The optimum etching temperature range using this material is from about 100° C. to about 120° C. The surface of the oxide and silicon are smooth after etching and the oxide step is sharp and well defined. The abbreviations used herein and throughout this description are:

| | |
|---|---|
| $d_{pr}$ | thickness of photoresist film |
| $R_{exp}$ | etch rate of $SiO_2$ beneath exposed photoresist |
| $R_{unexp}$ | etch rate of $SiO_2$ beneath unexposed photoresist |
| $S_s$ | spin speed during photoresist coating |
| $T_{hard}$ | photoresist hard bake temperature |
| $T_{soft}$ | photoresist soft bake temperature |
| $T_{sub}$ | etching temperature |
| $t_{exp}$ | photoresist exposure time |
| $t_{hard}$ | photoresist hard bake time |
| $t_{soft}$ | photoresist soft bake time |

EXAMPLE III

The general procedure of Example I was repeated on KTI 602 negative. Before use, this resist was thinned with 2 parts xylene to one part resist to allow a thinner film to be formed. In this case a negative pattern results, and a differential etch rate of 7.25 is not produced until the resist is exposed for 55 minutes. Both $R_{exp}$ and $R_{unexp}$ rise with etch temperature but the differential etch rate peaks at about 95° C. The differential etch rate peaks at soft and hard bake temperatures of 120° C. Spin speed and hence resist thickness appears to have little effect on either etch rate. The surfaces are once again smooth but the $SiO_2$ step was observed to have a gradual slope at the bottom for short etching times.

Because the etch rate is strongly dependent on the ultra violet dose, it is possible to obtain different oxide thicknesses on the same substrate after a single etch step by exposing the photoresist with different doses on different areas. This may be achieved by using different exposure times or by using a mask with varying degrees of transmission. Here, a single layer of KTI 602 was exposed in different areas for 2 minutes, 6 minutes, and 15 minutes and was etched for 11 minutes. The amount of oxide etched was 320 nm, 230 nm, and 155 nm respectively.

EXAMPLE IV

The procedure of Example I was repeated on KTI 809 positive. For exposure times of less than 100 seconds, this material produced a negative pattern with a differential etch rate of 0.71. However, by increasing the resist exposure time (with all other conditions being the same), a positive pattern is obtained up to a differential etch rate of 2.2. The effect of altering the etch temperature was demonstrated and a crossover point occurs between 82° C. and 92° C., where the pattern goes from negative to positive. For this material, there appears to be a rise in differential etch rate for increasing hard bake temperature and both etch rates rise slightly for increasing resist thickness. The surface is smooth when $T_{sub}$ is between 92° C. and 101° C., however, higher or lower etching temperatures lead to surface roughness and pattern distortion, with the edge of the pattern being somewhat unclear.

EXAMPLE V

The procedure of Example I was repeated on KTFR negative. This resist was diluted with xylene (KTFR:xylene=1:2) to attain the desired thicknesses. The etching effects were studied in detail for two distinct exposure ranges; short (4 seconds to 20 seconds) and long (1 minute to 50 minutes). A positive pattern is produced for short exposure times with a maximum differential etch rate near 2. In this case, etch temperature has a profound effect on $R_{exp}$ and $R_{unexp}$ and a weaker influence on the differential rate. In the long exposure region, a negative pattern results for exposure times in excess of 100 seconds, which is the opposite of the effect observed for KTI 809 in Example IV. Note that the individual etch rates are a strong function of etch temperature, and the differential rate also depends to some degree on etch temperature. The effects of the other parameters for the long exposure region showed that increasing soft and hard bake items the etch rate tended to decrease while film thickness has a weak effect on $R_{exp}$ and $R_{unexp}$.

EXAMPLE VI

The enhancement of the vapor etch rate in the presence of carbon was verified by depositing by sputtering thin films (5 nm thick) of pure carbon on one surface of the silicon oxide to cover about ½ the area thereof. The bare oxide and the carbon covered oxide were then etched simultaneously and the results, shown below, clearly demonstrate the enhanced rate resulting from the presence of carbon which, in this example was a factor of 5.

TABLE

| Etch Temp. (°C.) | Etch Rate (nm/min) | |
| --- | --- | --- |
| | with C | without C |
| 80 | 11.5 | 3.0 |
| 108 | 12.0 | 2.8 |
| 119 | 12.5 | 2.8 |
| 132 | 10.0 | 2.8 |

From the foregoing it is readily apparent that an etching device and method of using the same has been herein described and illustrated which fulfills all of the aforesaid objectives in a remarkably unexpected fashion. It is, of course, understood that such modifications, alterations, and adaptations, as may readily occur to the artisan skilled in the field to which this invention pertains when confronted with this specification, are intended within the spirit of the present invention which is limited only by the scope of the claims appended hereto.

What is claimed is:

1. A method of effecting pattern definitions on or in silicon dioxide comprising etching said silicon dioxide in hydrogen fluoride in the selective presence of carbon.

2. A method according to claim 1 in which said carbon is selectively applied to silicon dioxide as an inorganic carbon compound.

3. A method according to claim 1 in which said carbon is selectively applied to said silicon dioxide as an organic carbon compound.

4. A method according to claim 1 in which said carbon source is photoresist.

5. A method according to claim 2 in which said carbon is deposited on said silicon dioxide.

6. A method according to claim 3 in which said carbon is deposited on said silicon dioxide.

7. A method according to claim 4 in which said carbon is deposited on said silicon dioxide.

8. A method according to claim 2 in which said carbon is deposited in said silicon dioxide.

9. A method according to claim 3 in which said carbon is deposited in said silicon dioxide.

10. A method according to claim 4 in which said carbon is deposited in said silicon dioxide.

11. A method according to claim 1 in which said carbon is deposited on or in said silicon dioxide by a spin-on technique, physical vapor deposition, chemical vapor deposition, ion-implantation, focused ion-beam implantation, Langmuir-Blodgett film formation or by laser beam, electron beam or ion-beam stimulated chemical vapor deposition.

12. A method according to claim 4 in which said resist is exposed by a method selected from the group consisting of deep ultra-violet, highly focused electron-beam, ion-beam, laser-beam, blanket ion-beam and x-ray.

13. A method according to claim 1 in which said hydrogen fluoride is hydrated vapor in a nitrogen carrier.

* * * * *